(12) United States Patent
Bickford et al.

(10) Patent No.: US 9,255,962 B2
(45) Date of Patent: Feb. 9, 2016

(54) DETERMINING INTRA-DIE VARIATION OF AN INTEGRATED CIRCUIT

(71) Applicant: GLOBALFOUNDRIES INC., Grand Cayman (KY)

(72) Inventors: Jeanne P. S. Bickford, Essex Junction, VT (US); Aurelius L. Graninger, Essex Junction, VT (US); Christopher T. McEvoy, Burlington, VT (US); Joseph J. Oler, Jr., Jericho, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 67 days.

(21) Appl. No.: 13/967,491

(22) Filed: Aug. 15, 2013

(65) Prior Publication Data

US 2015/0048860 A1   Feb. 19, 2015

(51) Int. Cl.
*G01R 31/28* (2006.01)

(52) U.S. Cl.
CPC .................................. *G01R 31/2818* (2013.01)

(58) Field of Classification Search
CPC ... H01L 22/43; G01R 1/0491; G01R 31/2818
USPC .................... 716/12; 324/756.01; 714/718
See application file for complete search history.

(56) References Cited

U.S. PATENT DOCUMENTS

| 6,505,125 B1 * | 1/2003 | Ho ................................... 702/19 |
| 6,801,870 B2 * | 10/2004 | Corr .............................. 702/117 |
| 7,805,693 B2 | 9/2010 | Chadwick et al. |
| 7,890,906 B2 | 2/2011 | Chadwick et al. |
| 2008/0286888 A1 | 11/2008 | Hsu et al. |
| 2009/0031261 A1 | 1/2009 | Smith et al. |
| 2009/0063378 A1 * | 3/2009 | Izikson ........................... 706/21 |
| 2009/0106712 A1 * | 4/2009 | Bickford et al. ................... 716/4 |
| 2009/0278222 A1 | 11/2009 | Chadwick et al. |
| 2010/0045326 A1 | 2/2010 | Archer, III et al. |
| 2011/0026806 A1 | 2/2011 | Bernstein et al. |
| 2011/0066997 A1 | 3/2011 | O'Riordan et al. |
| 2011/0078641 A1 | 3/2011 | Culp et al. |
| 2012/0091454 A1 | 4/2012 | Liang et al. |
| 2012/0230136 A1 * | 9/2012 | Gorman et al. ................ 365/200 |
| 2014/0012533 A1 * | 1/2014 | Chabot-Couture ........... 702/130 |

OTHER PUBLICATIONS

Chun, et al.; "A 667 MHz Logic-Compatible embedded DRAM Featuring an Asymmetric 2T Gain Cell for High Speed On-Die Caches"; IEEE Journal of Solid-State Circuits; vol. 47; No. 2; Feb. 2012; pp. 547-559; Copyright 2011 IEEE.

(Continued)

*Primary Examiner* — Arleen M Vazquez
*Assistant Examiner* — Brent J Andrews
(74) *Attorney, Agent, or Firm* — Anthony J. Canale; Hoffman Warnick LLC

(57) ABSTRACT

Embodiments of the present invention disclose an apparatus and method to determine the intra-chip variation of an integrated circuit. In an embodiment, an apparatus comprises a test macro that includes two or more test structures; wherein each test structure includes identical copies of the same performance monitor; wherein each performance monitor has a unique bounding circuitry that encompasses the performance monitor; and wherein the two or more test structures are positioned close enough to each other as to reduce systematic across chip variation between the two or more test structures.

15 Claims, 4 Drawing Sheets

(56) References Cited

OTHER PUBLICATIONS

Dawn, et al.; "60-GHz integrated Transmitter Development in 90-nm CMOS"; IEEE Transactions on Microwave Theory and Techniques; vol. 57; No. 10; Dec. 2009; pp. 2354-2367; Copyright 2009 IEEE.

Doong, et al.; "Infrastructure Development and Integration of Electrical-Based Dimensional Process Window Checking"; IEEE Transactions on Semiconductor Manufacturing; vol. 17; No. 2; May 2004; pp. 123-141; Copyright 2004 IEEE.

Hees, et al.; "Logic Characterization Vehicle to Determine Process Variation Impact on Yield and Performance of Digital Circuits"; Proc. IEEE 2002 Int. Conference on Microelectronic Test Structures; vol. 15; Apr. 2002; pp. 189-196; Copyright 2002 IEEE.

"International Technology Roadmap for Semiconductors"; Test and Test Equipment; 2009 Edition.

Kumar, et al.; "A Comprehensive SoC design methodology for Nanometer design Challenges"; Tutorial T6; Proceedings of the 19th International Conferenece on VLSI Design (VLSID '06); IEEE Computer Society; Copyright 2006 IEEE.

Lee, et al.; "On Bounding the Delay of a Critical Path"; ICCAD '06; Nov. 5-9, 2006; San Jose, CA; pp. 81-88.

Ning Lu; "Modeling of Mismatch and Across-Chip Variations in Compact Device Models"; NSTI-Nanotech 2010; vol. 2; 2010; pp. 817-820.

Puri, et al.; "Technology Impacts on sub-90nm CMOS Circuit Design & Design methodologies"; Proceedings of the 19th International Conference on VLSI Design (VLSI '06); IEEE Computer Society; Copyright 2006 IEEE.

Anders Svensson; "The Adaptive Cross Validation Method—applied to the Control of Circuit Switched Networks"; pp. 967-970; Copyright 1996 IEEE.

Svensson, et al.; "The Adaptive Cross Validation Method: Design and Control of Dynamical Systems"; pp. 1575-1580; Copyright 1996 IEEE.

Veiga, et al.; "Estimation of RF PA Nonlinearities After Cross-Correlating Power Supply Current and Output Voltage"; Copyright 2009 IEEE.

Wang, et al.; "A Statistical Model Based ASIC Skew Selection Method"; pp. 64-66; Copyright 2004 IEEE.

Yen, et al.; "A Cross-Bridge Test Structure for Evaluating the Linewidth Uniformity of an Integrated Circuit Lithography System"; National Bureau of Standards; Washington DC; J. Electrochem. Soc.: Solid-State Science and Technology; Oct. 1982; pp. 2313-2318.

* cited by examiner

DETERMINING INTRA-DIE VARIATION OF AN INTEGRATED CIRCUIT

BACKGROUND

The present disclosure relates generally to the field of integrated circuit designs and performance, and more particularly to determining intra-die variation of an integrated circuit. Across chip variation (hereinafter "ACV") describes how two or more transistors or identical circuits behave on a given die or microchip (hereinafter "chip"). A die is a small block of semiconducting material on which a circuit is fabricated. ACV in a chip may present in one of two forms, systematic or random. Systematic ACV refers to the portion of ACV that is correlated to variations in specific electrical and/or physical parameters such as transistor threshold voltage or gate oxide thickness and is typically spatially correlated across the chip. Random ACV refers to the portion of ACV that is statistically independent of any known electrical of physical parameter and is typically not spatially correlated across the chip.

Chip manufacturing typically requires the use of semiconductor materials, dopants, metals, and insulators. Chips are fabricated in a layer process which includes imaging, deposition, and etching, all of which are typically supplemented by doping and cleaning. Mono-crystal silicon wafers are commonly used as the substrate. A wafer typically undergoes testing before being sent to die preparation, wherein all individual ICs present on the wafer are tested for functional defects and power-performance. One of the phenomena analyzed during testing is ACV, wherein an IC fails testing if its electrical characteristics are below or above a certain threshold. In addition to systematic ACV, an IC's electrical characteristics are also affected by a local region of influence effect, which describes the influence of the surrounding electrical structures on a particular circuit within the IC.

SUMMARY

Embodiments of the present invention disclose an apparatus and method to determine the intra-die variation of an integrated circuit. In an embodiment, an apparatus comprises a test macro that includes two or more test structures; wherein each test structure includes identical copies of the same performance monitor; wherein each performance monitor has a unique bounding circuitry that encompasses the performance monitor; and wherein the two or more test structures are positioned close enough to each other as to reduce systematic across chip variation between the two or more test structures.

DETAILED DESCRIPTION

Figure 1:
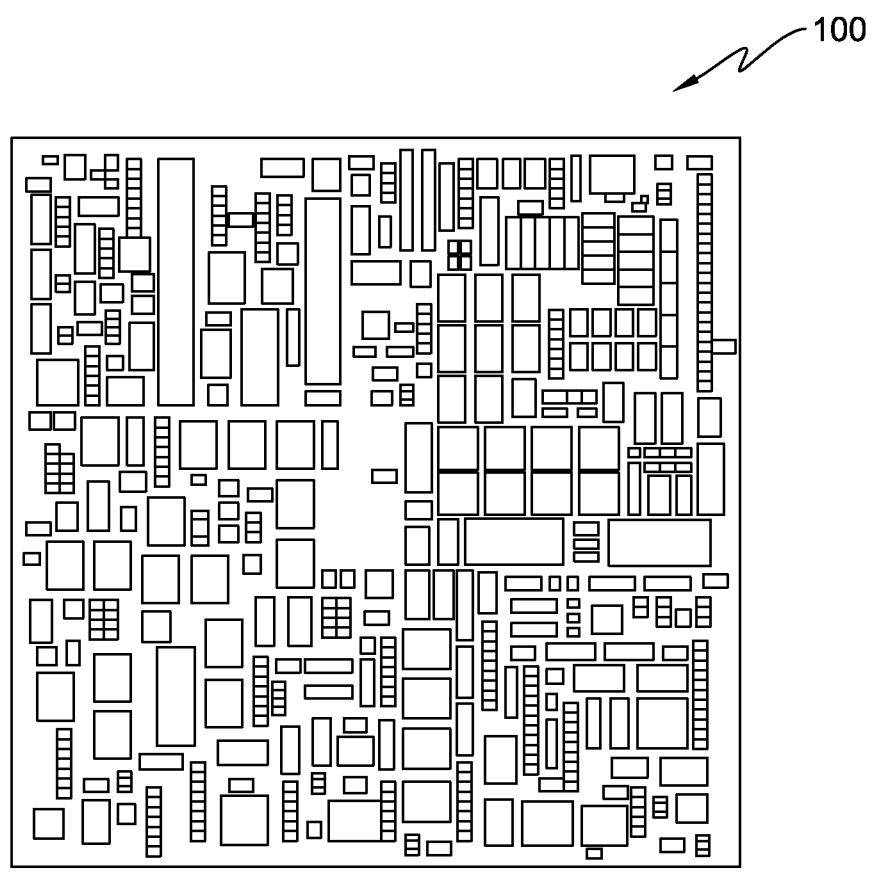
FIG. 1 depicts an example of a chip, in accordance with an embodiment of the present invention.

The present invention discloses a method and design for intra-die variation assessment of an integrated circuit. A microchip (hereinafter "chip") is an integrated circuit comprised of semiconductor material, typically silicon. Chips are manufactured in a multi-step sequence of photolithographic and chemical processing steps during which circuits, such as transistors, capacitors, and resistors, are gradually created on a wafer of semiconducting material, typically silicon. Chips are typically manufactured to include a plurality of different circuits, such as transistors, capacitors, and resistors, on many overlapping layers of semiconducting material. FIG. 1 depicts an example of a chip, generally designated 100, in accordance with an embodiment of the present invention. Chip 100 includes a plurality of different circuits and devices. The wafer typically undergoes testing before being diced, wherein all individual chips present on the wafer are tested for functional defects and power-performance screening.

Across chip variation (hereinafter "ACV") and region of influence (hereinafter "ROI") effects are some of the parameters that can be tested during chip preparation. ACV refers to the performance deviation that occurs spatially within any one chip (i.e. intra-chip variation). ACV may have a variety of sources depending on the physics of the manufacturing steps that determine the parameter of interest.

ACV can contribute to the loss of matched behavior between circuits in the same chip. The analysis of ACV is concerned with an entire set of elements, such as individual MOS transistors, signal lines or segments of signal lines, or any other geometric parameter or electrical parameter of the chip, and how such devices deviate from designed or nominal values, or how such devices thus differ unintentionally from each other. Causes of ACV include manufacturing variations, voltage variations, and temperature variations associated with the chip. Manufacturing variations that affect ACV include metal thickness variations due to chemical-mechanical polishing, random dopant effects which cause random voltage variations, and line-edge roughness effects.

Voltage variations include voltage drop across the surface of the chip and from cycle to cycle. Temperature variations include variations across the surface of the chip and variations from cycle to cycle. Electrical sources include coupling noise, pre-charging of internal nodes, and simultaneous switching. However, circuit performance may also be affected by the composition of its surrounding chip environment. Chip environment is the circuitry that encompasses a particular circuit. For example, a circuit that is located in a particular chip environment, for example, the lower-left region of chip 100, may perform differently when located in another chip environment, for example, the upper-right region of chip 100. Circuit behavior in a particular chip environment compared to that of another on the same chip is referred to as the region of influence (hereinafter "ROI") effect. ACV and ROI are determined using performance monitors (discussed below), which measures circuit behavior, such as timing. In an embodiment, the present invention seeks to characterize ACV in a manner that distinguishes it from ROI effects.

Figure 2:
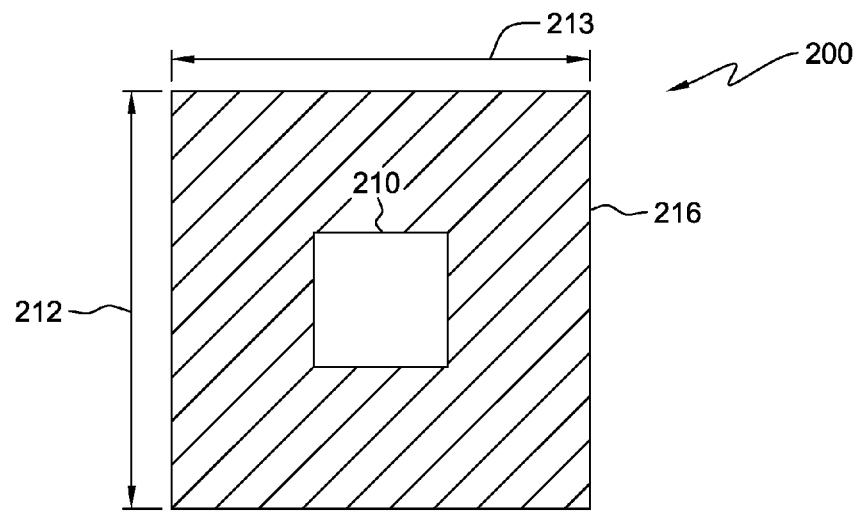
FIG. 2 depicts a test structure, in accordance with an embodiment of the present invention.

FIG. 2 depicts a test structure, generally designated 200, in accordance with an embodiment of the present invention. Test structure 200 is an apparatus used to distinguish between across chip variation (hereinafter "ACV") and region of influence (hereinafter "ROI") effects in a chip. In an embodiment, test structure 200 is used to characterize litho-induced variability, random dopant effects, and variability in oxide thickness of a given chip, for example, chip 400 of FIG. 4 (discussed below). Test structure 200 includes performance monitor structure 210, which is an electrical structure used to measure the performance characteristics of a chip. In an embodiment, performance monitor structure 210 is a ring oscillator that oscillates at a particular frequency. In another embodiment, performance monitor structure 210 is a ring of inverters or other gates, connected so as to oscillate, and whose frequency provides an indirect estimate of the performance of a critical path of a chip, such as chip 400. In yet another embodiment, performance monitor structure 210 includes delay lines that emulate a portion of the critical paths of chip 400. In other embodiments, performance monitor structure 210 is an individually wired-out transistor or plurality of transistors with measured alternating and/or direct current electrical characteristics.

Performance monitor structure 210 is encompassed by bounding circuitry 216, which includes at least one type of circuit, for example, transistors, synchronous dynamic random access memory, embedded dynamic random access memory, or base library logic elements. In an embodiment, bounding circuitry 216 includes uniform, varied, active, and/or inactive chip content. For example, chip content included in bounding circuitry 216 includes one or more circuits. In an embodiment, chip content included in bounding circuitry 216 includes space filler. Bounding circuitry 216 has a height and width defined by geometries 212 and 213, respectively. In an embodiment, test macro 200 includes a distance between bounding circuitry 216 and performance monitor structure 210, for example, 50 microns.

Figure 3:
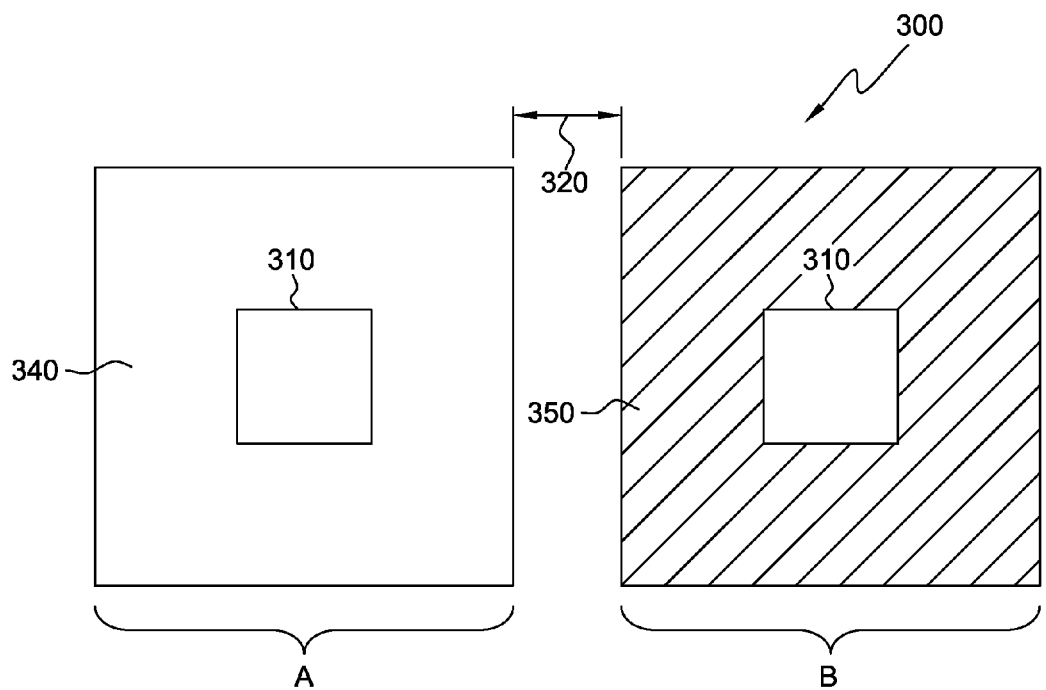
FIG. 3 depicts a test macro, in accordance with an embodiment of the present invention.

FIG. 3 depicts a test macro, in accordance with an embodiment of the present invention. FIG. 3 illustrates test macro 300, which is used to characterize the electrical performance of a chip. Specifically, test macro 300 includes test structures A and B. In an embodiment, test macro 300 includes two (2) or more test structures. Test structures A and B each include a copy of performance monitor 310. In another embodiment, performance monitor 310 is a circuit, for example, a ring oscillator, utilized to measure an aspect of chip performance at run time. Bounding circuitries 340 and 350 each include unique chip content, which may influence the performance of their respective copies of performance monitor 310.

Distance 320 is the distance between test structures A and B, for example, five (5) microns. Test structures, such as test structures A and B, are positioned in relative proximity to each other in a manner that minimizes systematic ACV present in measurements of each instance of performance monitor 310 included in test macro 300. Although test macros, such as test macro 300, are designed to minimize the influence of systematic ACV on a performance monitor measurement, random ACV may also be present. In an embodiment, test macro 300 is used to characterize the electrical performance characteristics of a chip, such as chip 400 (discussed below).

In another embodiment, test macro 300 is used to assess how a circuit's performance deviates from its designed or nominal performance values or how the circuit's electrical performance compares to that of a similar circuit. In general, distance 320 is a distance that facilitates measuring ACV by minimizing the influence of systematic ACV in a performance monitor measurement, in accordance with an embodiment of the present invention.

Figure 4A:
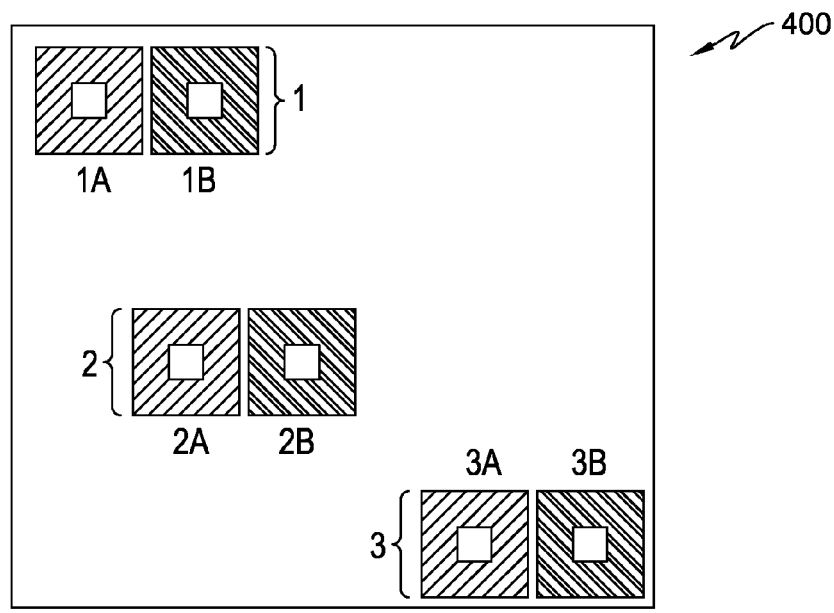
FIG. 4A depicts a chip, in accordance with an embodiment of the present invention.

FIG. 4A depicts a chip generally 400, in accordance with an embodiment of the present invention. FIG. 4A depicts chip 400, which includes test macro 1, 2, and 3. Test macros 1, 2, and 3 each include two test structure types, A and B, which correspond to 1A and 1B, 2A and 2B, and 3A and 3B, respectively. Test structures included in test macros 1, 2, and 3 each include a copy of the same performance monitor, for example, a ring oscillator. Test structures 1A, 2A, and 3A each include bounding circuitry that consists of, for example, ternary content addressable memory (hereinafter "TCAM"). Test structures 1B, 2B, and 3B each include bounding circuitry that consists of, for example, dynamic random access memory (hereinafter "DRAM"). In an embodiment, test macros, such as test macros 1, 2, and 3, are positioned on an area of chip 400 where electrical performance is being characterized.

Table 1 includes the time delay measurements for test macros 1, 2, and 3.

TABLE 1

| | | Macro Instance Time Delay (ns) | | |
|---|---|---|---|---|
| | | 1 | 2 | 3 |
| Bounding Circuitry | TCAM | 825 | 800 | 790 |
| | DRAM | 822 | 794 | 782 |

Figure 4B:
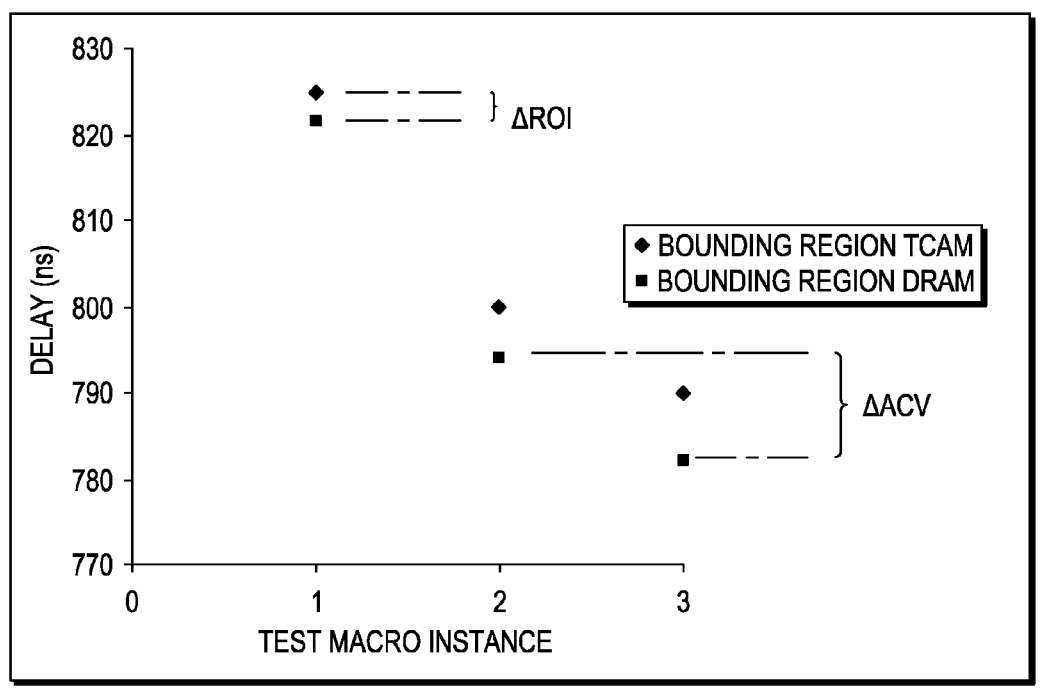
FIG. 4B depicts a graph, in accordance with an embodiment of the present invention.

FIG. 4B depicts a graph generally 410 in accordance with an embodiment of the present invention. FIG. 4B depicts graph 410, which illustrates test measurements, for example, frequency measurements, of test macros 1, 2, and 3. Graph 410 includes an x-axis and y-axis. Each unit on the X-axis of graph 410 represents a test macro instance, for example, test macros 1, 2, and 3, on chip 400 of FIG. 4A. For each X-axis unit, a test measurement, for example, a time delay measurement, is determined for each test structure included in the test macro instance, wherein the y-axis reflects the unit of measurement, for example, nanosecond (ns). In an embodiment, measurements of test macros 1, 2, and 3 of FIG. 4A are ascertained using standard electronic testing tools, for example, a frequency counter.

A ROI offset (hereinafter "ΔROI"), is the measurement difference, for example, frequency measurement, between the test structures of a test macro instance, such as test structures 3A and 3B of test macro 3. Measurements for test structures included in chip 400 are referred to using the M(X, N) notation, wherein X is the test macro instance, for example, test macro 3, and N refers to the test structure type, for example, type A. Hence, M(3, TCAM) is the measurement value for test structure A of test macro 3.

In an embodiment, ΔROI is determined using multiple copies of the same chip wherein the offsets are calculated and averaged. For example, to determine ΔROI, measure the electrical performance, such as the frequency, of all the test structures included in chip 400, for example, M(1, A), M(1, B), M(2, A), M(2, B), M(3, A), M(3, B). Determine ΔROI using equation [1].

$$M(i,j)-M(i,k) \quad [1]$$

wherein i refers to the test macro instance, for example, test macro 1, and where j and k refer to test structure type included in i, for example, test structures 1A and 1B. Hence, measurement M(1, TCAM) refers to the measurement of test structure A of test macro 1. For example, to compare the ring oscillator performance in the TCAM region of test structure 1 to that in the DRAM region apply equation [1] to the measurements included in Table 1, such as, M(1, TCAM)−M(1, DRAM); M(2, TCAM)−M(2, DRAM); and M(3, TCAM)−M(3, DRAM). The ring oscillators in TCAM regions on chip 400 rings are on average 5.7 ns slower than the same ring oscillators in DRAM regions and have a standard deviation of 2.5 ns. ΔROI for a chip, such as chip 400, for a given j, k pair is determined by calculating the mean of the ΔROI offsets. For example, the standard deviation of 2.5 ns is a measure of random ACV on chip 400.

In an embodiment, the total number of ΔROIs required to be determined for a chip, for example, chip 400, is dictated by equation [2].

$$X*(N-1) \quad [2]$$

wherein X is the total number of test macro instances present on the chip and N refers to the total number of test structure instances included per test macro. Hence, using equation [2], a total of three (3) offsets are required to be determined for chip 400. ΔROI for a given j, k pair on chip 400 is calculated by determining the mean of these three offsets.

A systematic ACV offset (hereinafter "ΔACV") is the measurement difference between similar test structure instances of differing test macro instances. For example, to determine ΔACV, between two locations on a chip, such as chip 400, measure the electrical performance, such as frequency, of all the test structure instances included in chip 400. In an embodiment, ΔACV between two similar test structure instances of different test macro instances included in chip 400 is determined using equation [3].

$$M(p,j)-M(q,j) \quad [3]$$

wherein p and q refer to different test macro instances, for example, test macros 1 and 2 of FIG. 3A, and j refers to a test structure type included in the test macros, for example, type A.

The total number of ΔACVs required to be determined for a chip, for example, chip 400, is determined using equation [4].

$$N*(X-1) \quad [4]$$

wherein X is the total number of test macro instances, such as test macros 1, 2, and 3, included on a chip, for example, chip 400, and N is the total number of test structure instances in a test macro instance. In an embodiment, systematic ACV between two regions on a chip, for example, chip 400, is determined by calculating the mean ΔACV for a p, q combination included on the chip. For example, to determine the ΔACV between test structures 1 and 2 apply equation [3] to the measurements included in Table 1, for example, M(1, TCAM)–M(2, TCAM); and M(1, DRAM)–M(2, DRAM). The result of the application reflects that ring oscillators in test macro 1 are on average 26.5 ns slower than ring oscillators in test macro 2 and have a standard deviation of 2.1 ns. Systematic ACV is the portion of ACV that is correlated to a physical affect of a chip, for example, non-uniform wafer thickness. In addition, systematic ACV is typically spatially correlated across the chip.

Random ACV is the portion of ACV that is statistically independent of any known electrical or physical effect. In an embodiment, random ACV for a chip, such as chip 400, is determined by calculating the average standard deviation of all ΔROIs and ΔACVs using an appropriate statistical method.

Figure 5:
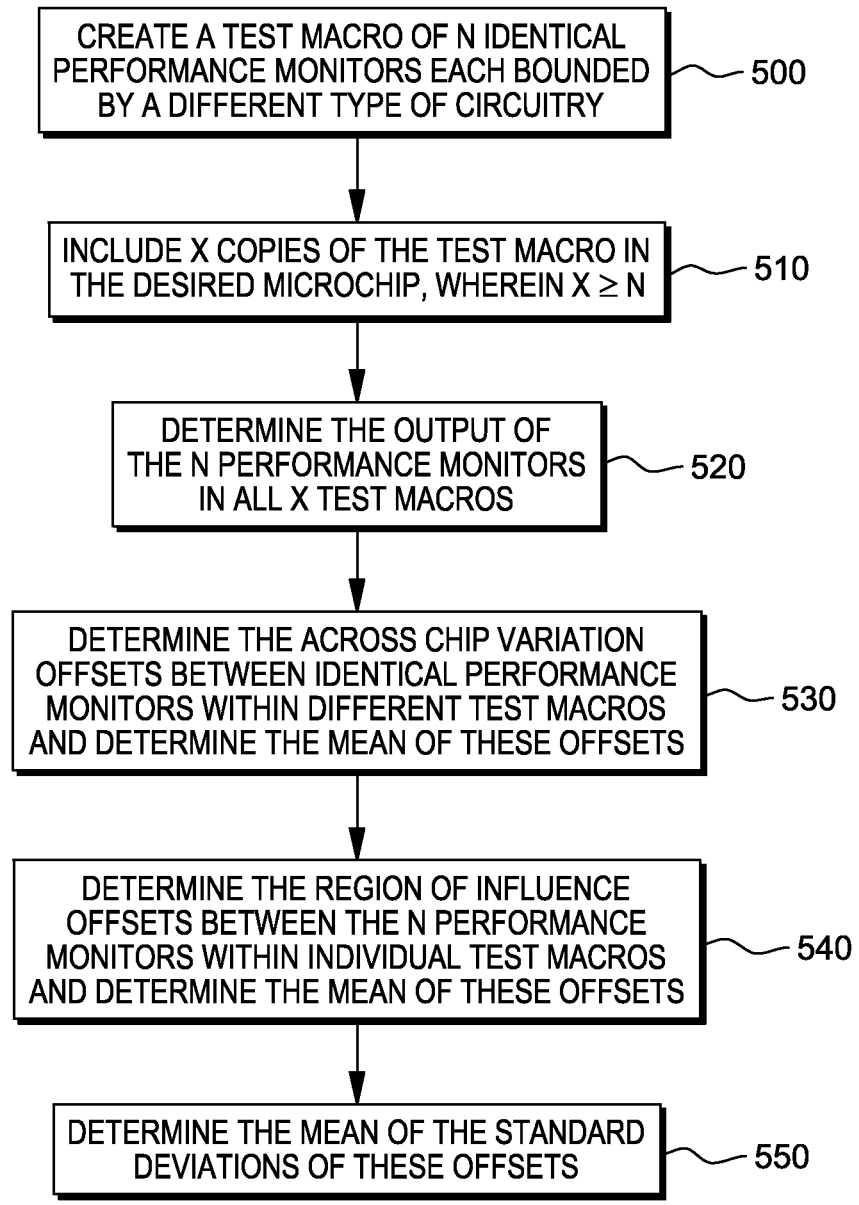
FIG. 5 illustrates operational steps to determine ACV and ROI in the chip of FIG. 4A, in accordance with an embodiment of the present invention.

FIG. 5 illustrates operational steps to determine ACV and ROI present in chip 400 of FIG. 4A, in accordance with an embodiment of the present invention. Create a test macro of N identical performance monitors each bounded by a different type of circuitry (step 500). Include X copies of the test macro in the desired chip, wherein X is greater than or equal to N (step 510). Determine the performance output of the N performance monitors in all X test macros (step 520). Determine the ACV offsets between the N performance monitors within individual test macros and determine the mean of these offsets (step 530). Determine ROI offsets between identical performance monitors within different test macros and determine the mean of these offsets (step 540). Determine the mean of the standard deviations of the offsets to determine random ACV (step 550).

What is claimed is:

1. An apparatus comprising:
   at least one test macro, that includes:
   two test structures;
   wherein each test structure includes identical copies of a performance monitor;
   wherein each performance monitor has a unique binding circuitry that encompasses the performance monitor, wherein one binding circuitry includes ternary content addressable memory (TCAM) and another binding circuitry includes dynamic random access memory (DRAM) such that the two test structures are identical except for the unique binding circuitry of each performance monitor; and
   wherein the two test structures are positioned in relative proximity to each other in a manner that minimizes systematic intra-chip variation between the two test structures.

2. The apparatus of claim 1, wherein the performance monitor is an individually wired-out transistor or plurality of transistors with measured alternating and/or direct current electrical characteristics, or an electronic component.

3. The apparatus of claim 1, wherein the performance monitor is a ring of inverters or gates connected so as to oscillate at a frequency that provides an indirect estimate of a critical path included in an integrated circuit.

4. The apparatus of claim 1, wherein the test macro is a semiconductor device.

5. The apparatus of claim 1, wherein the bounding circuitry further includes an electronic component and/or space filler.

6. The apparatus of claim 1, wherein the apparatus is designed to be included on a chip.

7. A method comprising:
   at least one test macro, that includes:
   two test structures;
   wherein each test structure includes identical copies of a performance monitor;
   wherein each performance monitor has a unique binding circuitry that encompasses the performance monitor, wherein one binding circuitry includes ternary content addressable memory (TCAM) and another binding circuitry includes dynamic random access memory (DRAM) such that the two test structures are identical except for the unique binding circuitry of each performance monitor;
   wherein the two test structures are positioned in relative proximity to each other in a manner that minimizes systematic intra-chip variation between the two or more test structures; providing a plurality of the test macros on an integrated circuit;
   determining region of influence measurement differences associated with the integrated circuit by placing two or more test macros included in the plurality of test macros on the integrated circuit within two regions of varying content;
   determining systematic intra-chip variation associated with the integrated circuit; and
   determine random intra-chip variation associated with the integrated circuit.

8. The method of claim 7, wherein the test macro is a semiconductor device.

9. The method of claim 7, wherein the performance monitor is an individually wired-out transistor or plurality of transistors that have a measured alternating and/or direct current electrical characteristic.

10. The method of claim 7, wherein the performance monitor is a ring of inverters or gates connected so as to oscillate at a frequency that provides an indirect estimate of a critical path included in the integrated circuit.

11. The method of claim 7, wherein the performance monitor is an electronic component.

12. The method of claim 7, wherein the bounding circuitry further includes an electronic component and/or space filler.

13. The method of claim 7, wherein the determining of the region of influence measurement differences includes determining the mean of all measurement differences between pairs of performance monitors of a test macro.

14. The method of claim 7, wherein the determining of the systematic intra-chip variation associated with the integrated circuit includes determining the mean of all measurement differences between performance monitors that have substantially similar bounding regions of different test macros included in the plurality of test macros.

15. The method of claim 7, wherein the determining of the random intra-chip variation associated with the integrated circuit includes determining the mean of the standard deviations of all measurement differences.

* * * * *